(12) United States Patent
Franke

(10) Patent No.: US 8,836,063 B2
(45) Date of Patent: Sep. 16, 2014

(54) INTEGRATED PASSIVE COMPONENT

(75) Inventor: Joerg Franke, Freiburg (DE)

(73) Assignee: Micronas GmbH, Freiburg LBr. (DE)

( * ) Notice: Subject to any disclaimer, the term of this patent is extended or adjusted under 35 U.S.C. 154(b) by 0 days.

(21) Appl. No.: 13/464,327

(22) Filed: May 4, 2012

(65) Prior Publication Data

US 2012/0280342 A1 Nov. 8, 2012

(30) Foreign Application Priority Data

May 4, 2011 (DE) .......................... 10 2011 100 485

(51) Int. Cl.
| | | |
|---|---|---|
| H01L 29/82 | (2006.01) | |
| H01L 27/22 | (2006.01) | |
| H01L 23/522 | (2006.01) | |
| H01L 49/02 | (2006.01) | |
| H01L 23/00 | (2006.01) | |

(52) U.S. Cl.
CPC ............ *H01L 23/5227* (2013.01); *H01L 27/22* (2013.01); *H01L 2924/19107* (2013.01); *H01L 2223/6672* (2013.01); *H01L 24/48* (2013.01); *H01L 28/10* (2013.01); *H01L 2224/48091* (2013.01)
USPC ......................................................... 257/427

(58) Field of Classification Search
CPC ........ H01L 27/22; H01L 29/82; H01L 43/065
USPC ..................................... 257/427, 499; 438/22
See application file for complete search history.

(56) References Cited

U.S. PATENT DOCUMENTS

| | | | |
|---|---|---|---|
| 5,689,138 A | 11/1997 | Dekker et al. | |
| 6,856,225 B1 | 2/2005 | Chua et al. | |
| 7,112,950 B2 * | 9/2006 | Reinhold et al. | ........... 324/117 H |
| 7,834,464 B2 | 11/2010 | Meyer et al. | |
| 2001/0009795 A1 | 7/2001 | Chu et al. | |
| 2007/0069397 A1 * | 3/2007 | Van Lerberghe et al. | ...... 257/784 |
| 2008/0290992 A1 * | 11/2008 | Hoeglauer et al. | ........... 340/10.1 |
| 2009/0066066 A1 | 3/2009 | Franke | |
| 2013/0020660 A1 * | 1/2013 | Milano et al. | .................. 257/427 |

FOREIGN PATENT DOCUMENTS

| | | |
|---|---|---|
| DE | 695 24 730 T2 | 8/2002 |
| DE | 601 22 343 T2 | 12/2006 |
| DE | 600 32 336 T2 | 6/2007 |
| DE | 699 37 868 T2 | 6/2007 |
| DE | 10 2008 050 972 A1 | 4/2009 |

* cited by examiner

*Primary Examiner* — Matthew W Such
*Assistant Examiner* — Warren H Kilpatrick
(74) *Attorney, Agent, or Firm* — Muncy, Geissler, Olds & Lowe, P.C.

(57) ABSTRACT

An integrated passive component having a semiconductor body, arranged on a metal substrate and having a first surface, and a plurality of metal surfaces formed on the surface, a passivation layer formed on the surface, an integrated circuit formed near the surface of the semiconductor body, whereby the integrated circuit is connected to metal surfaces via traces formed below the passivation layer, a part of the metal surfaces is connected to pins via bonding wires, and a first coil formed above the passivation layer, whereby the first coil with a plurality of turns has a longitudinal axis formed substantially parallel to the surface of the semiconductor body, and in a lower part of the first coil, said part which is formed substantially parallel to the longitudinal axis of the coil on the surface of the semiconductor body, parts of a plurality of turns are formed as sections of traces.

15 Claims, 1 Drawing Sheet

INTEGRATED PASSIVE COMPONENT

This nonprovisional application claims priority under 35 U.S.C. §119(a) to German Patent Application No. DE 10 2011 100 485.1, which was filed in Germany on May 4, 2011, and which is herein incorporated by reference.

BACKGROUND OF THE INVENTION

1. Field of the Invention

The invention relates to an integrated passive component.

2. Description of the Background Art

DE 600 32 336 T2, DE 699 37 868 T2 (which corresponds to U.S. Pat. No. 6,410,974), and DE 10 2008 050 972 A1 (which corresponds to U.S. Pat. No. 7,834,464) disclose different approaches for integrating a coil on or with or in a semiconductor body. Thus, for example, the formation of a spiral inductor in the different trace layers under the passivation of the semiconductor body is known from the disclosure in DE 600 32 336 T2.

SUMMARY OF THE INVENTION

It is therefore an object of the invention to provide a device that refines the state of the art. According to an embodiment, an integrated passive component is provided having a semiconductor body, arranged on a metal substrate and having a first surface, and a plurality of metal surfaces formed on the surface, a passivation layer formed on the surface, an integrated circuit formed near the surface of the semiconductor body, whereby the integrated circuit is connected to metal surfaces by means of traces formed below the passivation layer, a part of the metal surfaces is connected to pins by means of bonding wires, and a first coil formed above the passivation layer, whereby the first coil with a plurality of turns has a longitudinal axis formed substantially parallel to the surface of the semiconductor body, and in a lower part of the first coil, said part which is formed substantially parallel to the longitudinal axis of the coil on the surface of the semiconductor body, parts of a plurality of windings are formed as sections of traces.

An advantage of the integrated passive component of the invention is that a component, formed as a coil and having a plurality of windings, can be integrated into a standard semiconductor fabrication process. It should be noted that in general each winding of the coil has a trace section and a wire section. Tests by the applicant have shown that according to the device of the invention coils with a high rating, preferably a rating above 5, most preferably with a rating above 10, can be integrated cost-effectively and reliably. In this case, the sections formed as traces, of the lower part of the coil and the metal surfaces can be produced cost-effectively and reliably during a standard manufacturing process for integrated circuits, preferably without additional process steps. After the metal process, which is generally carried out repeatedly to form a plurality of trace layers, a passivation layer formed preferably as a dielectric layer is produced after the formation of the topmost trace layer. In this case, in a so-called pad window etching process, the metal surfaces, which are connected to the traces and which preferably are formed in the topmost metal layer and are called pads, are etched free. Next, the top part of the coil can be produced by means of a bonding process by drawing a bonding wire from one metal surface to another metal surface. As a result, the sections of the individual turns, which are made as wire or, for example, also as litz wire, are formed above the passivation layer. As stated above, it is preferred to produce the lower part of the coil, i.e., the section of each winding, which is formed as a trace, at a wafer level and only then to dice the wafer, which includes a plurality of semiconductor bodies, which are also called dies. Preferably, the dies or the individual semiconductor bodies are arranged on a metal substrate, also called a lead frame. In a subsequent bonding process, the top part of the coil, i.e., those parts of the windings of the coil that are formed above the semiconductor surface preferably of wire, can be produced by means of a bonding wire. Furthermore, the other metal surfaces are connected to the so-called pins by means of the bonding process. The pins are used primarily for an electrical contacting of the integrated circuit. It is understood that a part or all connections of the coil, for example, also a center tap of the coil, can be connected to pins. As a result, the coil in a housed state can also be contacted from the outside and supplied with external signals.

In an embodiment, the connections of the coil are connected to the integrated circuit. As a result, resonant circuits in particular can be completely integrated.

A magnetic field sensor, which can be formed as a Hall sensor, can be arranged in or at the lower part of the coil in the surface, preferably below the passivation layer of the semiconductor body. Tests by the applicant have shown that it is possible to arrange the magnetic field sensor between two turns formed as traces. As a result, an especially high penetration of the magnetic field sensor with magnetic field lines is achieved.

According to an embodiment, it is possible to form a second coil within the first coil and in this way to achieve a transformer coupling between both coils. It is preferred to form the sections of turns of the second coil, said sections formed as traces, in a trace layer above the trace layer of the sections for the turns of the first coil.

As the fabrication of the first coil and of the second coil as well can be readily integrated cost-effectively into the fabrication process, it is preferred to arrange both the coils and the semiconductor body in a single mutual housing. In this regard, the housing, which can be formed of plastic, is produced in a so-called molding process. For example, a QFN housing with an integrated coil can be formed.

In an application, the integrated passive component can be used for magnetic field-free position measurement. In this regard, the change in inductance in the first coil or second coil, because of an approach of the component to a magnetic material, is determined as a measure of the distance. Because the measured change in inductance is compared with values from a predetermined value field, in a known arrangement the distance of the component to the magnetic material can be determined.

In another application, the passive component can be used for calibrating and testing magnetic field sensors. To this end, a current is applied to the coil above of the magnetic field sensor. In this regard, both the current can be adjusted in such a way that an outer magnetic field is shielded and thereby the magnetic field sensor is virtually or completely magnetic field-free, and in an alternative application a magnetic field with a defined strength is generated so that, for example, in the case of the Hall sensor a specific Hall voltage is present.

In an application, the component is used for transmitting data from a coil to a magnetic field sensor. In this case, data can be transmitted in the form of an optocoupler in a likewise galvanically decoupled manner by means of a preferably changing magnetic field.

In another application, the dynamic measuring range can be increased by means of the combination of coil and magnetic field sensor. In comparison to magnetic fields designed thus far only for magnetic field sensors and accordingly changing slowly over time, now in addition the strength of rapidly changing magnetic fields can also be determined by means of the induction in the coil.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
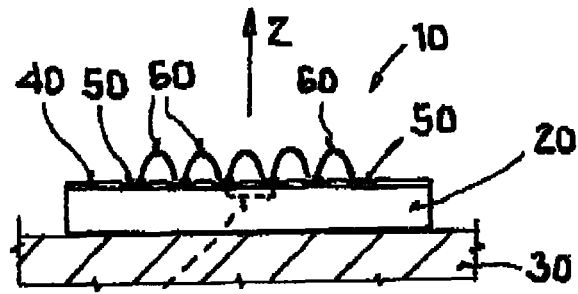
FIG. 1 is a schematic cross-sectional view of a first embodiment.

The illustration in FIG. 1 shows an embodiment of an integrated passive component 10, having a semiconductor body 20 on a metal substrate 30. Semiconductor body 20 has on the surface a passivation layer 40 with openings. Passivation layer 40 has a nitride layer. Metal surfaces 50 (not shown) are formed in the openings of passivation layer 40, which are produced by a so-called pad window etching process. Preferably, a part of metal surfaces 50 is formed near the edge of semiconductor body 20 (not shown). A first coil with a plurality of turns is formed on the surface of semiconductor body 20. The longitudinal axis of the first coil is formed substantially parallel to the surface of semiconductor body 20 with a lower part, which runs in the surface of semiconductor body 20, and an upper part. The lower part is formed as a trace (not visible) below passivation layer 40, whereas the upper part of the first coil is formed of sections of wires 60, preferably bonding wires, above the passivation layer. As a result, a turn of the first coil has, in each case, a section of a trace 65 (not visible), which is connected at both ends to a metal surface, and a section of a wire 60. Wire 60 has two ends, each of which is connected to a metal surface (not shown). The wires are connected to the metal surfaces by standard bonding processes.

A magnetic field sensor 70 is integrated almost in the middle in the surface of semiconductor body 20 in the lower half of the coil. The strength of the magnetic field of the coil can be determined very precisely by magnetic field sensor 70, which is formed preferably as a Hall sensor. The current strength in the coil can be determined from the strength of the magnetic field. It should be noted, however, that the magnetic field sensor is superfluous provided that the coil is used as part of a resonant circuit, for example, within the scope of an integrated circuit.

Figure 2:
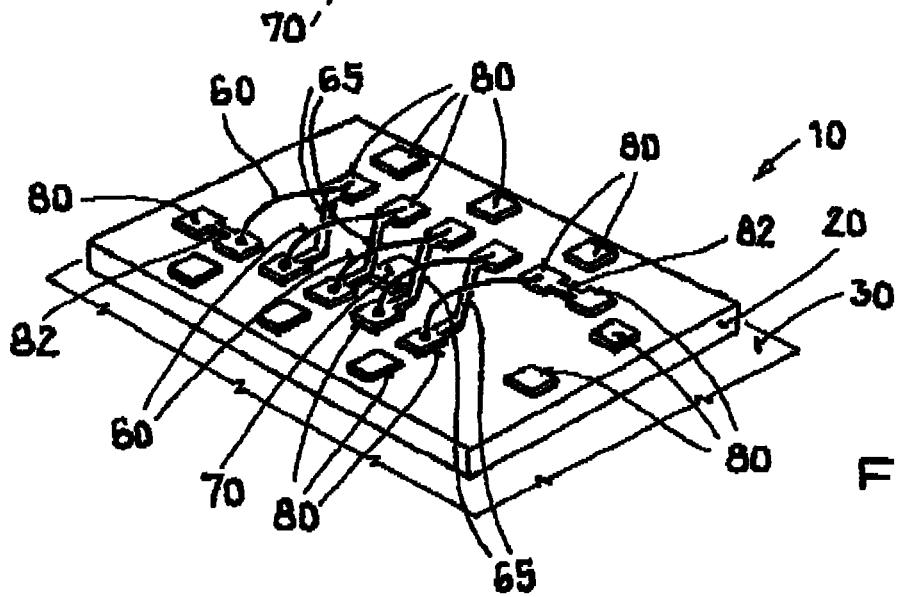
FIG. 2 is a perspective view of the embodiment of FIG. 1.

A plan view of the embodiment of FIG. 1 is shown in FIG. 2. Only the differences in regard to the illustration in FIG. 1 will be explained below. For reasons of illustration, passivation layer 40 is not shown. The upper part of the coil is formed from sections of wires 60. The lower part of the first coil is formed from traces 65. The individual wires 60 each end on a metal surface 80. Metal surfaces 80 are connected in an alternating manner to a wire 60 or a trace 65. To make sections of the wires short, preferably the immediately opposite metal surfaces of the coil are connected by means of wires 60, whereas metal surfaces 80 offset laterally to one another are connected to traces 65. The last metal surface 80 of the coil is connected at the left or the right outer end of the coil by means of a trace section 82 in each case to a free metal surface 80 in order to connect the coil to pins by means of a bonding wire.

Figure 3:
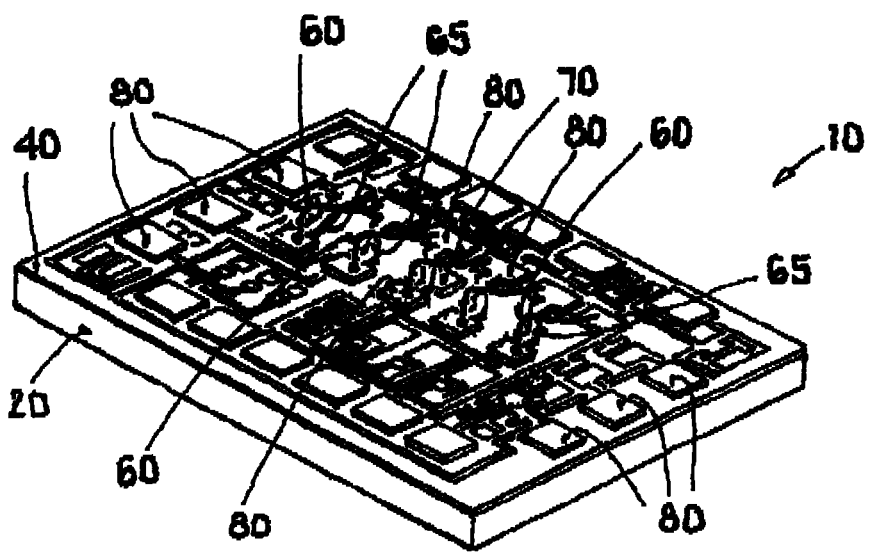
FIG. 3 is a schematic plan view of an embodiment of an integrated coil and an integrated circuit.

Another embodiment is shown in a plan view in FIG. 3. Only the differences in regard to the embodiment of FIG. 2 will be explained below. The coil with the sections of wires 60 and the sections of traces 65 is shown here as part of an integrated circuit. The coil can be used inter alia as a resonant circuit coil. According to the design of the coil and the connection of the other metal surfaces to the pins (not shown), in a subsequent molding process semiconductor body 20 can be integrated together with the coil in the same housing (not shown).

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated passive component comprising:
a semiconductor body arranged on a metal substrate, said semiconductor body having a first surface and a second surface, with a plurality of metal surfaces formed on the first surface and having an entire extent of said second surface contacting said metal substrate;
a passivation layer formed on the first surface;
an integrated circuit formed in the semiconductor body near the first surface of the semiconductor body, the integrated circuit being connectable to the metal surfaces via traces formed in the semiconductor body below the passivation layer, a portion of the metal surfaces being connectable to pins via bonding wires; and
a first coil having a lower part and an upper part and having a plurality of turns, said first coil further having a longitudinal axis formed substantially parallel to the first surface of the semiconductor body,
wherein, in said lower part of the first coil, parts of said plurality of turns are formed as sections of the traces formed in the semiconductor body below said passivation layer and at least one turn of the first coil is formed from a wire in said upper part above the passivation layer.

2. The integrated passive component according to claim 1, wherein the wire is connected via a bond to a metal surface and to a trace.

3. The integrated passive component according to claim 1, wherein the coil is connected to the integrated circuit.

4. The integrated passive component according to claim 1, wherein a magnetic field sensor is formed below the lower part of the coil in the surface of the semiconductor body.

5. The integrated passive component according to claim 1, wherein the magnetic field sensor is arranged between two turns formed as traces.

6. The integrated passive component according to claim 1, wherein a magnetic field sensor is arranged between two traces of the coil winding.

7. The integrated passive component according to claim 5, wherein the magnetic field sensor is formed as a Hall sensor.

8. The integrated passive component according to claim 1, wherein the semiconductor body and the first coil are arranged in a single housing.

9. The integrated passive component according to claim 1, wherein a second coil is provided within the first coil.

10. The integrated passive component according to claim 9, wherein sections of turns of the second coil that are formed as traces, are formed in a trace layer above the trace layer of the sections for the turns of the first coil.

11. The integrated passive component according to claim 8, wherein the housing is formed of plastic.

12. The integrated passive component according to claim 1, wherein the integrated passive component is for magnetic field-free position measuring.

13. The integrated passive component according to claim 1, wherein the integrated passive component is for measuring magnetic fields.

14. The integrated passive component according to claim 1, wherein the integrated passive component is for calibrating and testing magnetic field sensors.

15. The integrated passive component according to claim 1, wherein the integrated passive component is for transmitting data to a magnetic field sensor.

* * * * *